(12) United States Patent
Ito

(10) Patent No.: US 11,347,121 B2
(45) Date of Patent: May 31, 2022

(54) ELECTRO-OPTICAL DEVICE AND ELECTRONIC APPARATUS

(71) Applicant: SEIKO EPSON CORPORATION, Tokyo (JP)

(72) Inventor: Satoshi Ito, Eniwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 155 days.

(21) Appl. No.: 16/817,840

(22) Filed: Mar. 13, 2020

(65) Prior Publication Data

US 2020/0292892 A1 Sep. 17, 2020

(30) Foreign Application Priority Data

Mar. 14, 2019 (JP) .............................. JP2019-046677

(51) Int. Cl.
*G02F 1/1362* (2006.01)
*H01L 27/12* (2006.01)
(Continued)

(52) U.S. Cl.
CPC ...... *G02F 1/136213* (2013.01); *G02F 1/1368* (2013.01); *G02F 1/136209* (2013.01);
(Continued)

(58) Field of Classification Search
CPC .............. H01L 27/1222; H01L 27/124; H01L 29/78633; H01L 29/78621; H01L 29/78675; H01L 27/1255; G02F 1/136209; G02F 1/1368; G02F 1/136213; G02F 1/136286; G02F 2201/40; G02F 1/13629; G02F 1/136281

See application file for complete search history.

(56) References Cited

U.S. PATENT DOCUMENTS 11,132,950 B2 * 9/2021 Ota ........................ G09G 3/325
2003/0184699 A1 10/2003 Matsumoto et al.
(Continued)

FOREIGN PATENT DOCUMENTS

JP 2003-295207 A 10/2003
JP 2005-202337 A 7/2005
(Continued)

*Primary Examiner* — Hoan G Nguyen
(74) *Attorney, Agent, or Firm* — Oliff PLC

(57) ABSTRACT

An electro-optical device includes a substrate, a pixel electrode disposed at the substrate, and a pixel circuit portion disposed between the substrate and the pixel electrode. The pixel circuit portion includes a scanning line disposed along a first direction, a data line disposed along a second direction intersecting the first direction, a first constant potential line disposed along the scanning line, a second constant potential line disposed along the data line, and a transistor disposed corresponding to an intersection position of the scanning line and the data line and including a gate electrode electrically coupled to the scanning line, a source region electrically coupled to the data line, and a drain region electrically coupled to the pixel electrode. The pixel circuit portion also includes a coupling portion disposed corresponding to the intersection position and configured to electrically couple the first constant potential line and the second constant potential line.

7 Claims, 9 Drawing Sheets

(51) Int. Cl.
*G02F 1/1368* (2006.01)
*H01L 29/786* (2006.01)

(52) U.S. Cl.
CPC ...... *G02F 1/136286* (2013.01); *H01L 27/124* (2013.01); *H01L 27/1222* (2013.01); *H01L 27/1255* (2013.01); *H01L 29/78621* (2013.01); *H01L 29/78633* (2013.01); *H01L 29/78675* (2013.01)

(56) References Cited

U.S. PATENT DOCUMENTS

| | | | |
|---|---|---|---|
| 2015/0270429 A1* | 9/2015 | Jiroku | H01L 27/14603 257/458 |
| 2016/0351600 A1* | 12/2016 | Moriwaki | G02F 1/1368 |
| 2018/0067368 A1 | 3/2018 | Izawa et al. | |
| 2019/0331972 A1* | 10/2019 | Nimura | G02F 1/136286 |

FOREIGN PATENT DOCUMENTS

| JP | 2016-053641 A | 4/2016 |
|---|---|---|
| JP | 2018-40969 A | 3/2018 |

* cited by examiner

ELECTRO-OPTICAL DEVICE AND ELECTRONIC APPARATUS

The present application is based on, and claims priority from JP Application Serial Number 2019-046677, filed Mar. 14, 2019, the disclosure of which is hereby incorporated by reference herein in its entirety.

BACKGROUND

1. Technical Field

The present disclosure relates to an electro-optical device and an electronic apparatus.

2. Related Art

A electro-optical device is known, such as a liquid crystal device, that is used as a light valve of a projector, for example. A liquid crystal device described in JP-A-2018-40969 is provided with scanning lines, data lines, and a pixel electrode and a thin film transistor provided for each of a plurality of pixels. Further, the liquid crystal device is provided with a shield layer for the data lines and a shield layer for the scanning lines, in order to prevent fluctuations in the potential of a drain electrode and to secure a holding capacitance.

However, in the liquid crystal device of the related art, the potential of the two shield layers varies individually depending on the influence of the scanning lines or the data lines, or the like, and as a result, the potential difference between these shield layers fluctuates from pixel to pixel. Thus, there is a problem in that a change in the holding capacitance may occur for each of the pixels, and as a result, there is a risk that an operating failure, such as display unevenness, may occur.

SUMMARY

An aspect of an electro-optical device of the present disclosure includes a substrate that includes a display region, a pixel electrode disposed at the display region, and a pixel circuit portion disposed between the display region. The pixel circuit portion includes a scanning line disposed along a first direction, a data line disposed along a second direction intersecting the first direction, a first constant potential line disposed along the scanning line, a second constant potential line disposed along the data line, and a transistor disposed corresponding to an intersection position of the scanning line and the data line, and including a gate electrode electrically coupled to the scanning line, a source region electrically coupled to the data line, and a drain region electrically coupled to the pixel electrode. The pixel circuit portion also includes a coupling portion disposed corresponding to the intersection position and configured to electrically couple the first constant potential line and the second constant potential line.

DESCRIPTION OF EXEMPLARY EMBODIMENTS

Figure 1:
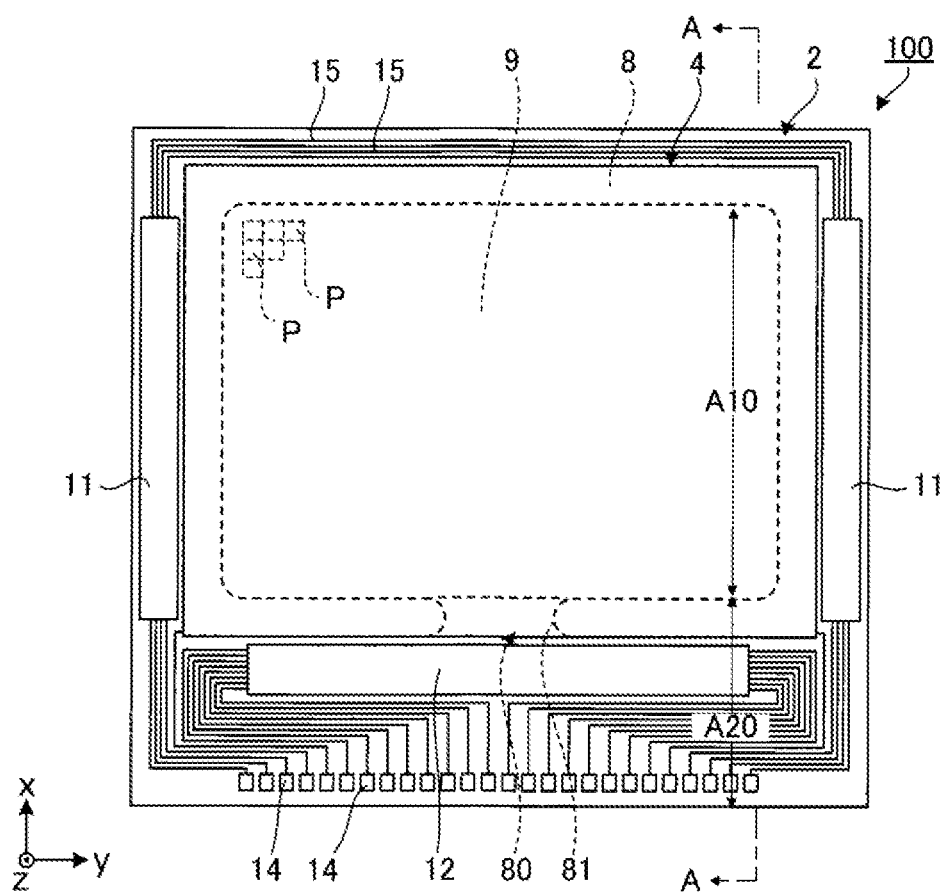
FIG. 1 is a plan view of an electro-optical device according to an embodiment.

Preferred embodiments of the present disclosure will be described below with reference to the accompanying drawings. Note that, in the drawings, dimensions and scales of each of components differ from actual dimensions and scales as appropriate, and some sections are schematically illustrated for ease of understanding. Further, the scope of the present disclosure is not limited to these embodiments unless it is otherwise stated that the present disclosure is to be limited in the following description.

1. Electro-Optical Device

An example of the electro-optical device of the present disclosure is an active matrix-type liquid crystal device.

1-1. Basic Configuration

Figure 2:
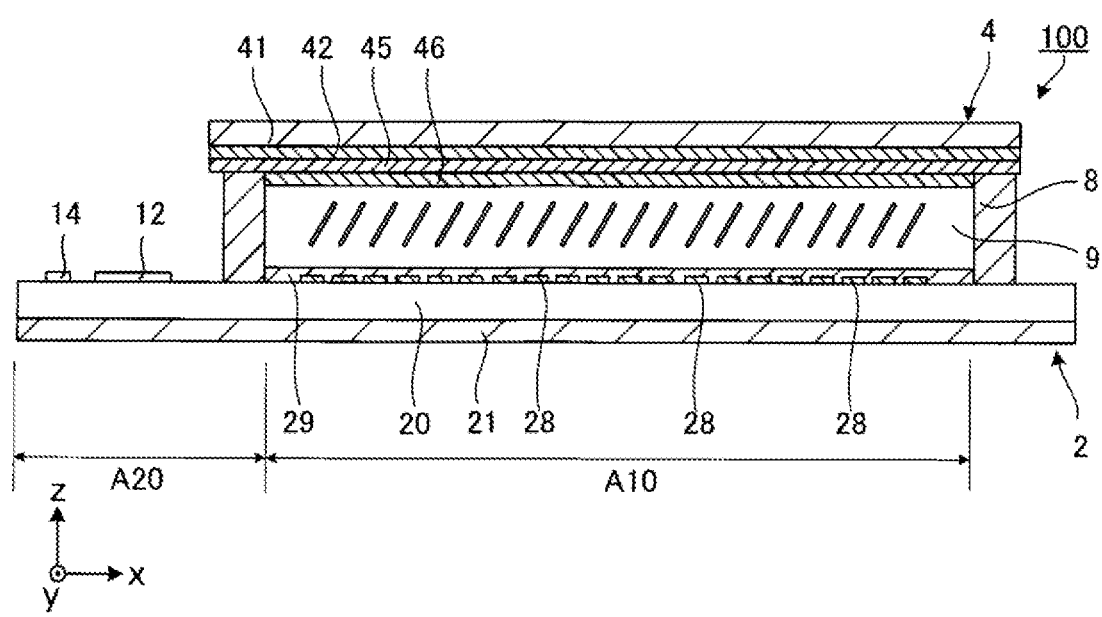
FIG. 2 is a cross-sectional view of the electro-optical device according to the embodiment.

FIG. 1 is a plan view of an electro-optical device 100 according to an embodiment. FIG. 2 is a cross-sectional view of the electro-optical device 100 according to the embodiment, along a line A-A in FIG. 1. Note that, for convenience of explanation, the description below will be made appropriately using an x axis, a y axis, and a z axis that are orthogonal to each other, as illustrated in FIG. 1 and FIG. 2. Below, a tip side of an arrow indicating the direction of each axis is referred to as a "positive side", and a base end side of the arrow is referred to as a "negative side". In addition, the direction of the arrow for the x axis is a positive x direction, and the opposite direction is a negative x direction. Note that the same applies to the y axis and the z axis. In the embodiment, a "first direction" is the positive y direction, and a "second direction" intersecting the "first direction" is the negative x direction. Further, a "third direction" in which a first substrate 21 and a pixel electrode 28 to be described below overlap with each other is the negative z direction. In addition, viewing from the negative z direction is referred to simply as "plan view".

The liquid crystal display device 100 illustrated in FIG. 1 and FIG. 2 is a transmission-type liquid crystal display device. As illustrated in FIG. 2, the electro-optical device 100 includes a transmissive element substrate 2, a transmissive counter substrate 4, a frame-shaped sealing member 8, and a liquid crystal layer 9. The sealing member 8 is disposed between the element substrate 2 and the counter substrate 4. The liquid crystal layer 9 is disposed in a region surrounded by the element substrate 2, the counter substrate 4, and the sealing member 8. Here, the direction in which the counter substrate 4, the liquid crystal layer 9, and the element substrate 2 are layered is the negative z direction, and the front surface of the element substrate 2 is parallel to the x-y plane.

With respect to the electro-optical device 100, light may be incident from the element substrate 2, transmitted through the liquid crystal layer 9, and emitted from the counter substrate 4, or may be incident from the counter substrate 4, transmitted through the liquid crystal layer 9, and emitted from the element substrate 2. Further, the light transmitted through the electro-optical device 100 is visible light. In this specification, "transmissive" means transmittance of visible light, and preferably refers to a transmittance of visible light equal to or greater than 50%. Further, as illustrated in FIG. 1, the liquid crystal display device 100 has a rectangular shape in plan view, but the shape of the liquid crystal display device 100 in plan view is not limited to the rectangular shape and may be a round shape or the like.

As illustrated in FIG. 1, the element substrate 2 has a size encompassing the counter substrate 4 in plan view. As illustrated in FIG. 2, the element substrate 2 includes a first substrate 21 as the "substrate", a pixel circuit portion 20, a plurality of pixel electrodes 28, and a first alignment film 29. The first substrate 21, the pixel circuit portion 20, the plurality of pixel electrodes 28, and the first alignment film 29 are layered in this order. The first alignment film 29 is located closest to the liquid crystal layer 9. The first substrate 21 is configured by a flat plate having transmissive and insulating properties. The first substrate 21 is formed of glass, quartz, or the like, for example. The pixel circuit portion 20 includes various wiring lines. The plurality of pixel electrodes 28 are transmissive and are configured by a transparent conductive material, such as indium tin oxide (ITO) or indium zinc oxide (IZO), for example. The first alignment film 29 aligns liquid crystal molecules of the liquid crystal layer 9. Examples of a constituent material of the first alignment film 29 include polyimide and silicon oxide, for example. Note that the pixel circuit portion 20 will be described in detail below.

As illustrated in FIG. 2, the counter substrate 4 includes a second substrate 41, a light-transmitting layer 42, a counter electrode 45, and a second alignment film 46. The second substrate 41, the light-transmitting layer 42, the counter electrode 45, and the second alignment film 46 are layered in this order. The second alignment film 46 is located closest to the liquid crystal layer 9. The second substrate 41 is configured by a flat plate having transmissive and insulating properties. The second substrate 41 is formed of glass, quartz, or the like, for example. The light-transmitting layer 42 is formed from a silicon based inorganic material having transmissive and insulating properties, such as silicon oxide, for example. The counter electrode 45 is formed of a transparent conductive material, such as ITO or IZO, for example. The second alignment film 46 aligns the liquid crystal molecules of the liquid crystal layer 9. Examples of the constituent material of the second alignment film 46 include polyimide and silicon oxide, for example.

The sealing member 8 is formed using an adhesive or the like containing various types of curable resin, such as epoxy resin, for example. The sealing member 8 is affixed to each of the element substrate 2 and the counter substrate 4. As illustrated in FIG. 1, an injection port 81 for injecting a liquid crystal material containing liquid crystal molecules is formed in a portion of the sealing member 8, and the injection port 81 is sealed by a sealing material 80 formed using various types of resin material.

The liquid crystal layer 9 contains the liquid crystal molecules having positive or negative dielectric anisotropy. The liquid crystal layer 9 is interposed between the element substrate 2 and the counter substrate 4, such that the liquid crystal molecules are in contact with both the first alignment film 29 and the second alignment film 46. The alignment of the liquid crystal molecules contained in the liquid crystal layer 9 varies depending on a voltage applied to the liquid crystal layer 9. The liquid crystal layer 9 allows gray scale display by modulating the light in accordance with the applied voltage.

Further, as illustrated in FIG. 1, a plurality of scanning line drive circuits 11 and a data line drive circuit 12 are provided on a surface, of the element substrate 2, facing the counter substrate 4. Further, a plurality of external terminals 14 are disposed on the surface, of the element substrate 2, facing the counter substrate 4. The external terminals 14 are coupled with routed wiring lines 15 routed from each of the scanning line drive circuits 11 and the data line drive circuit 12.

The electro-optical device 100 having such a configuration includes a display region A10 that displays images and the like, and a peripheral region A20 that surrounds the display region A10 in plan view. A plurality of pixels P arrayed in a matrix pattern are provided in the display region A10. The scanning line drive circuits 11, the data line drive circuit 12, and the like are disposed in the peripheral region A20. Note that, in addition to the plurality of pixels P contributing to display, the display region 10A may include dummy pixels that do not contribute to the display and that are disposed surrounding the plurality of pixels P.

1-2. Electrical Configuration

Figure 3:
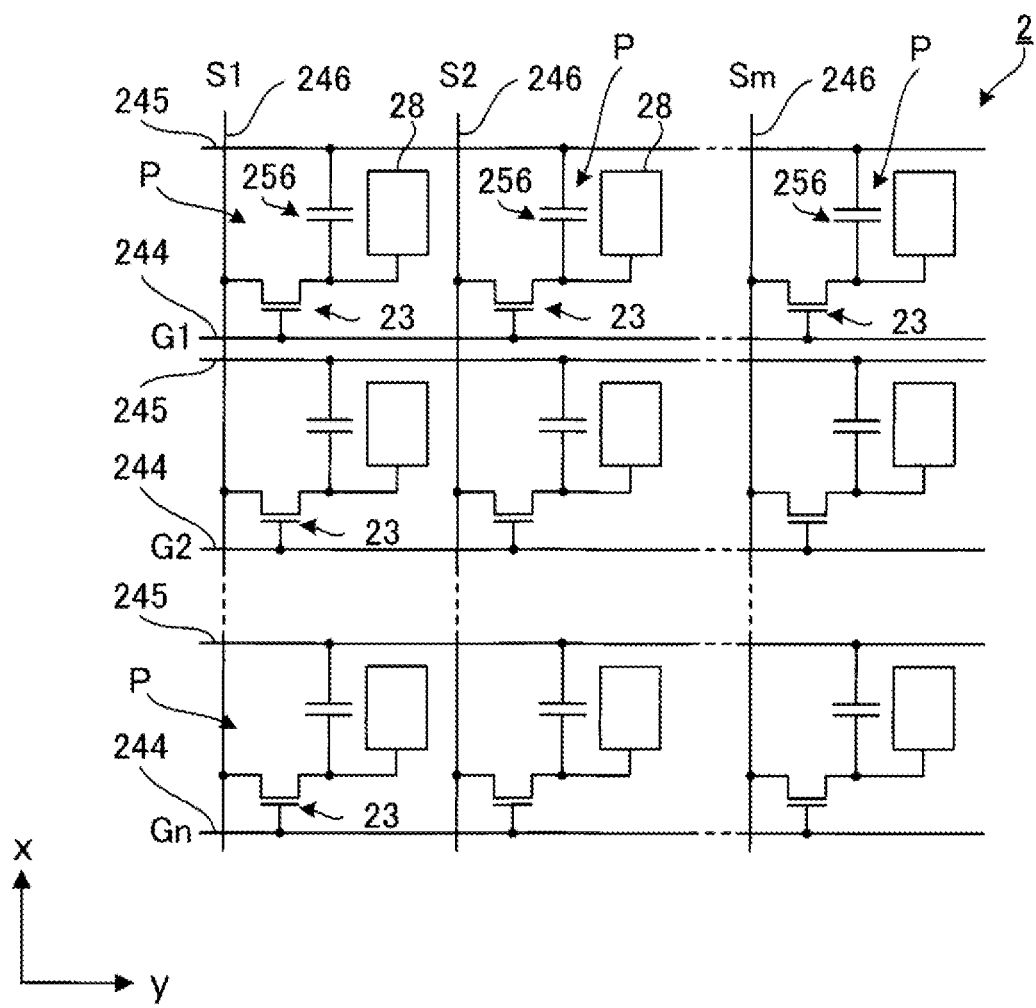
FIG. 3 is an equivalent circuit diagram illustrating an electrical configuration of an element substrate according to the embodiment.

FIG. 3 is an equivalent circuit diagram illustrating an electrical configuration of the element substrate 2 according to the embodiment. As illustrated in FIG. 3, n scanning lines 244, m data lines 246, and n first constant potential lines 245, which are capacitance lines, are provided on the element substrate 2. Note that both n and m are integers of 2 or greater.

The n scanning lines 244 extend in the positive y direction, respectively, and are arranged at equal intervals in the negative x direction. The scanning line 244 is electrically coupled to a gate of a transistor 23. Further, the n scanning lines 244 are electrically coupled to the scanning line drive circuits 11 illustrated in FIG. 1. Scanning signals G1, G2, to Gn are line-sequentially supplied from the scanning line drive circuit 11 to the n scanning lines 244.

The m data lines 246 illustrated in FIG. 3 extend in the negative x direction, respectively, and are arranged at equal intervals in the positive y direction. The data line 246 is electrically coupled to a source of the transistor 23. Further, the m data lines 246 are electrically coupled to the data line drive circuit 12 illustrated in FIG. 1. Image signals S1, S2, to Sm are supplied in parallel from the data line drive circuit 12 to the m data lines 246.

The n scanning lines 244 and the m data lines 246 illustrated in FIG. 3 are insulated from each other and are formed in a lattice-like pattern in plan view. A region surrounded by two of the adjacent scanning lines 244 and two of the adjacent data lines 246 corresponds to the pixel P. Each one of the pixel electrodes 28 is formed in each one of the pixels P. Each one of the transistors 23 is provided corresponding to each one of the pixel electrodes 28. The pixel electrode 28 is electrically coupled to the corresponding transistor 23. The transistor 23 controls switching of the corresponding pixel electrode 28. The transistor 23 is a TFT that functions as a switching element, for example.

The n first constant potential lines 245 extend in the positive y direction, respectively, and are arranged at equal intervals in the negative x direction. Further, the n first constant potential lines 245 are insulated from the plurality of data lines 246 and the plurality of scanning lines 244, and are formed so as to be separated from these lines. A constant potential, such as a ground potential, is applied to the first constant potential line 245. Further, a storage capacitor 256 is provided in parallel with a liquid crystal capacitor, between the first constant potential line 245 and the pixel electrode 28, to prevent leakage of a charge held in the liquid crystal capacitor. The storage capacitor 256 is a capacitance element for holding the potential of the pixel electrode 28 in accordance with the supplied image signal Sm.

The scanning signals G1, G2, to Gn become sequentially active and, when the n scanning lines 244 are sequentially selected, the transistor 23 coupled to the selected scanning line 244 is turned to an ON state. Then, the image signals S1, S2, to Sm having magnitudes corresponding to the grayscale to be displayed are transmitted, via the m data lines 246, to the pixel P corresponding to the selected scanning line 244, and are then applied to the pixel electrode 28. In this way, a voltage that corresponds to the grayscale to be displayed is applied to the liquid crystal capacitor formed between the pixel electrode 28 and the counter electrode 45 of the counter substrate 4 illustrated in FIG. 2, and the alignment of the liquid crystal molecules changes in accordance with the applied voltage. Further, the applied voltage is held by the storage capacitor 256. Such a change in the alignment of the liquid crystal molecules causes the light to be modulated, thus enabling the grayscale display.

1-3. Pixel Circuit Portion 20

Figure 4:
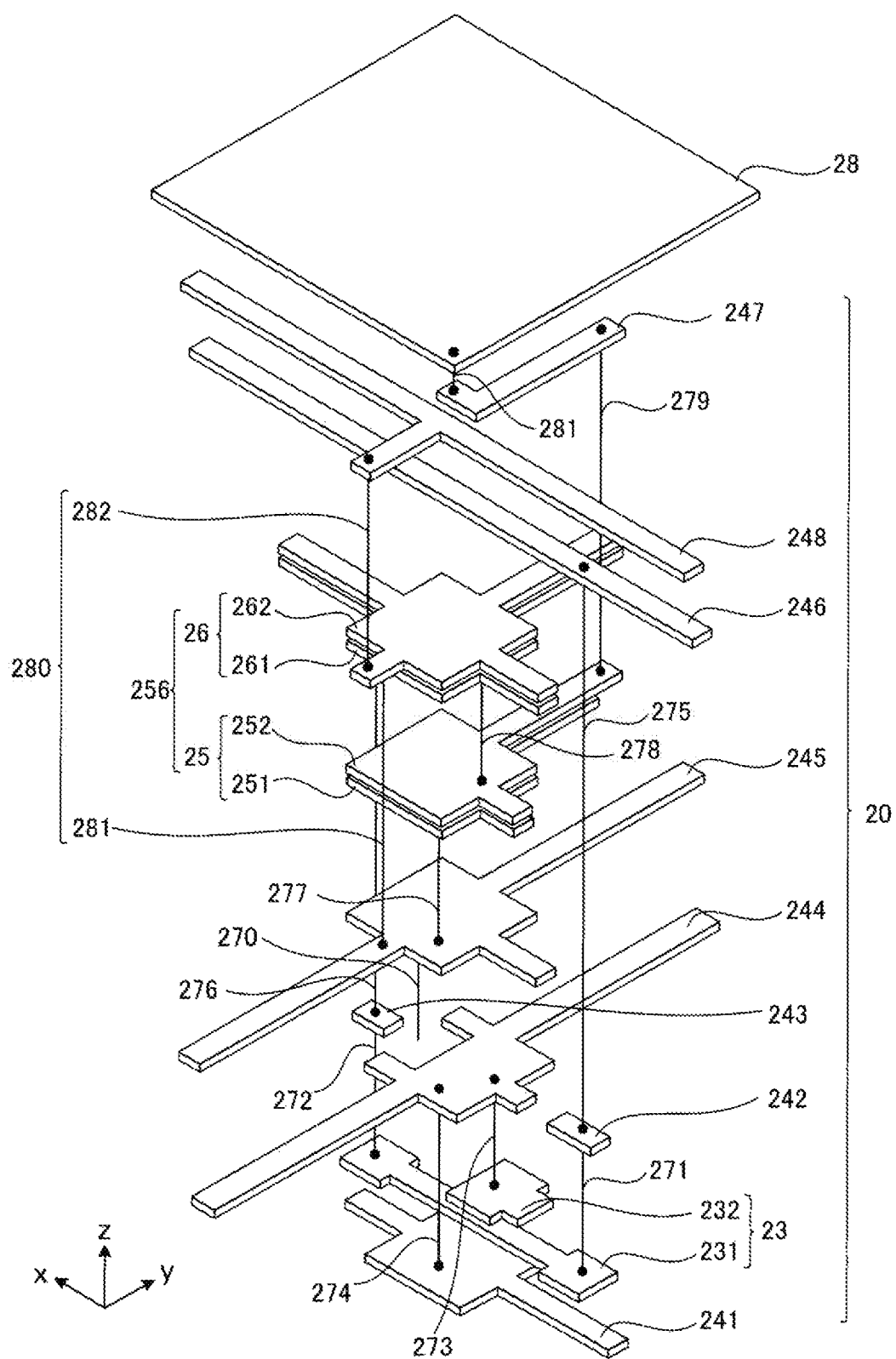
FIG. 4 is an exploded perspective view illustrating a part of various wiring lines included in a pixel circuit portion according to the embodiment.

FIG. 4 is an exploded perspective view illustrating a part of various wiring lines included in the pixel circuit portion 20 according to the embodiment. In FIG. 4, the various wiring lines relating to one of the pixels P are illustrated. As illustrated in FIG. 4, the pixel circuit portion 20 includes a light-shielding body 241, the transistor 23, a source wiring line 242, a drain wiring line 243, the scanning line 244, the first constant potential line 245, the storage capacitor 256, the data line 246, a coupling wiring line 247, and a second constant potential line 248. The transistor 23, the scanning line 244, the first constant potential line 245, the storage capacitor 256, the data line 246, and the second constant potential line 248 are arranged in this order from the light-shielding body 241 toward the pixel electrode 28. Further, the light-shielding body 241, the transistor 23, the source wiring line 242, the drain wiring line 243, the storage capacitor 256, and the coupling wiring line 247 are provided for each of the pixels P described above. In other words, these are provided for each of the pixel electrodes 28.

The scanning line 244, the first constant potential line 245, the data line 246, and the second constant potential line 248 are each disposed across the plurality of the pixels P. Further, the first constant potential line 245 is disposed corresponding to the scanning line 244. Specifically, the first constant potential line 245 is disposed substantially parallel to the corresponding scanning line 244 along the positive y direction. The first constant potential line 245 overlaps with the corresponding scanning line 244 in plan view. The first constant potential line 245 functions as a shielding line with respect to the scanning line 244. Further, the second constant potential line 248 is disposed corresponding to the data line 246. Specifically, the second constant potential line 248 is disposed substantially parallel to the corresponding data line 246 along the negative x direction. The second constant potential line 248 overlaps with the corresponding data line 246 in plan view. The second constant potential line 248 functions as a shielding line with respect to the data line 246.

Figure 5:
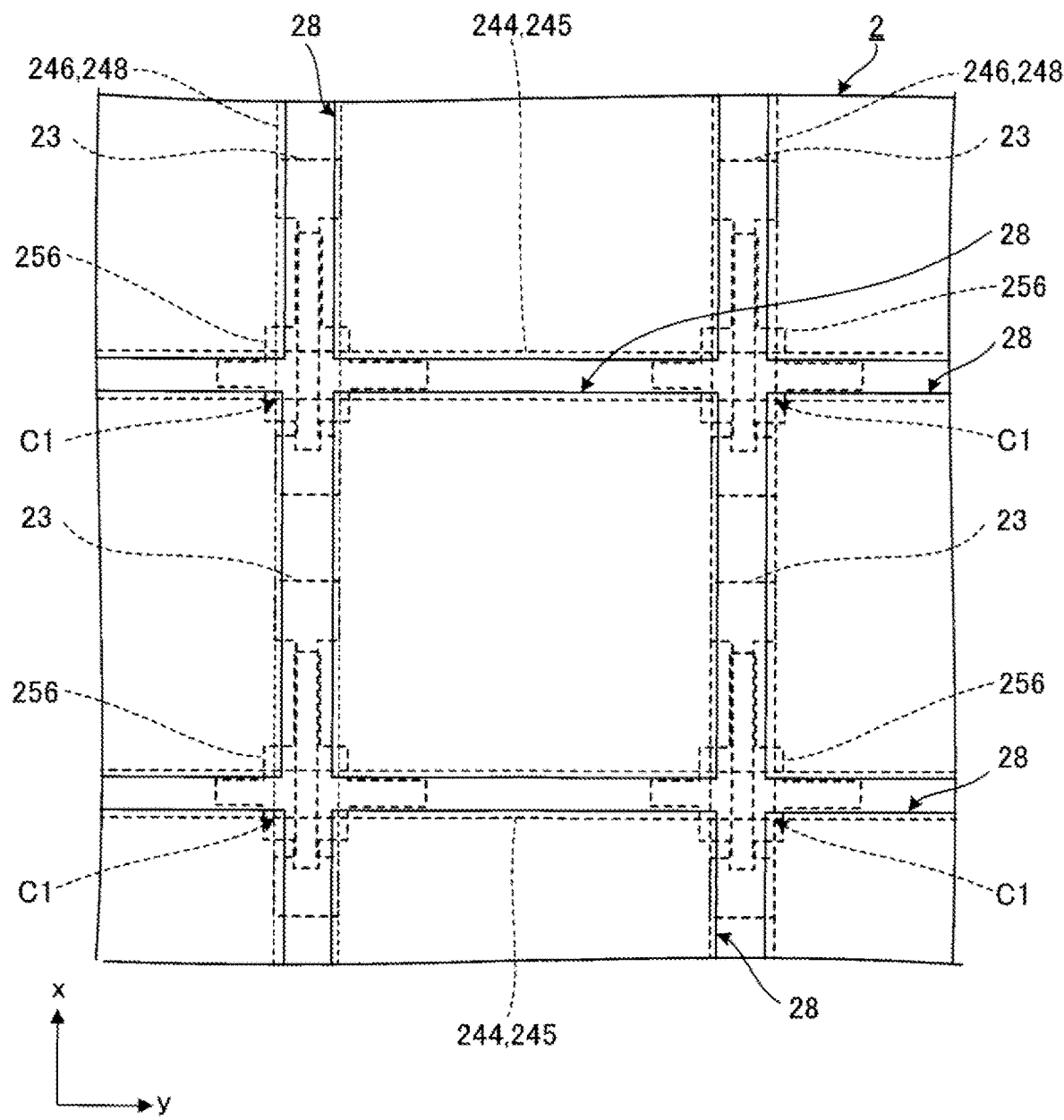
FIG. 5 is a plan view illustrating a part of the pixel circuit portion and a pixel electrode according to the embodiment.

FIG. 5 is a plan view illustrating a part of the pixel circuit portion 20 and the pixel electrode 28 according to the embodiment. As illustrated in FIG. 5, the plurality of scanning lines 244 and the plurality of data lines 246 form a lattice-like pattern in plan view. Similarly, the plurality of first constant potential lines 245 and the plurality of second constant potential lines 248 form a lattice-like pattern in plan view.

In plan view, the pixel electrode 28 overlaps with a region surrounded by two of the adjacent scanning lines 244 and two of the adjacent data lines 246. One of the transistors 23 and one of the storage capacitors 256 are provided corresponding to one of the pixel electrodes 28. The transistor 23 and the storage capacitor 256 are disposed corresponding to an intersection position C1 of the scanning line 244 and the data line 246. Specifically, a part of each of the transistor 23 and the storage capacitor 256 overlaps with the intersection position C1. The intersection position C1 is a portion at which the scanning line 244 and the data line 246 intersect in plan view, and is a portion at which the scanning line 244 and the data line 246 overlap each other.

Note that, although not illustrated in FIG. 5, one of the light-shielding bodies 241, one of the source wiring lines 242, one of the drain wiring lines 243, and one of the coupling wiring lines 247 are provided corresponding to one of the pixel electrodes 28. Further, the light shielding-body 241, the source wiring line 242, the drain wiring line 243, and the coupling wiring line 247 are disposed corresponding to the intersection position C1.

Figure 6:
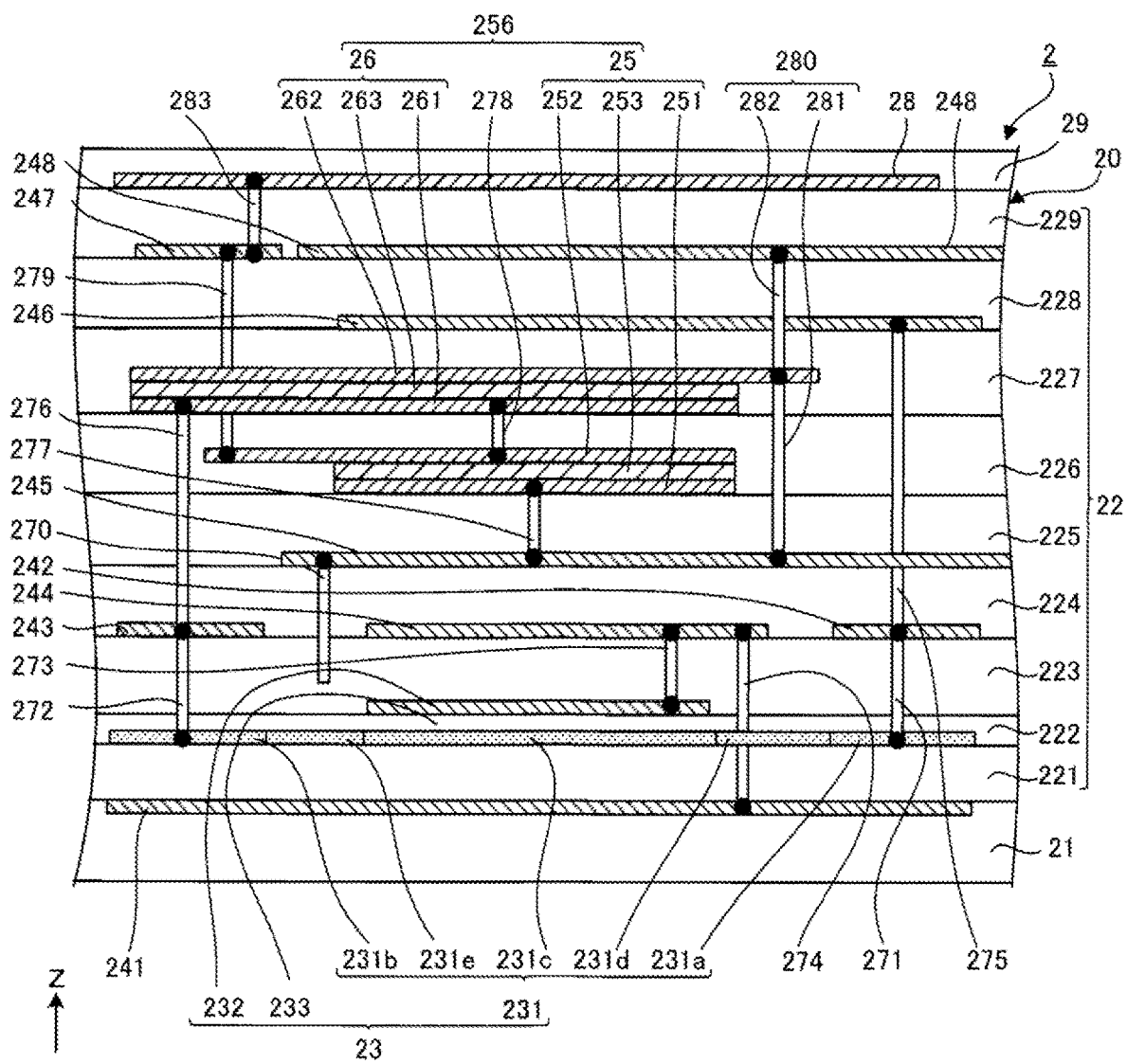
FIG. 6 is a cross-sectional view schematically illustrating a part of the element substrate according to the embodiment.

FIG. 6 is a cross-sectional view schematically illustrating a part of the element substrate 2 according to the embodiment. Note that FIG. 6 is a view focusing on one of the pixels P. In FIG. 6, the arrangement of various wiring lines is schematically illustrated for ease of understanding.

As illustrated in FIG. 6, the pixel circuit portion 20 is disposed between the first substrate 21 and the pixel electrode 28. The light-shielding body 241 included in the pixel circuit portion 20 is disposed on the first substrate 21. The light-shielding body 241 has light-shielding properties and electrical conductivity. Note that the light-shielding body 241 may be disposed within a recessed portion provided in the first substrate 21. The recessed portion is formed by damascene processing, for example. Further, examples of the constituent material of the light-shielding body 241 include metals such as tungsten (W), titanium (Ti), chromium (Cr), iron (Fe), aluminum (Al), and the like, metal nitrides, metal silicides, and the like. Of these, tungsten is preferable. Among the various metals, tungsten has excellent heat resistance, and the optical density (OD) value does not easily decline even when heat treatment is performed during manufacturing, for example. Thus, as a result of the light-shielding body 241 containing tungsten, the incidence of light on the transistor 23 can be prevented particularly effectively by the light-shielding body 241.

The various wiring lines included in the pixel circuit portion 20 are disposed on a transmissive insulator 22 included in the pixel circuit portion 20. The insulator 22 is disposed on the first substrate 21 covering the light-shielding body 241. The insulator 22 includes insulating layers 221, 222, 223, 224, 225, 226, 227, 228 and 229. These layers are arranged in this order from the first substrate 21 toward the pixel electrode 28. These layers are each composed of a silicon oxide film formed by thermal oxidation or chemical vapor deposition (CVD), for example.

A semiconductor layer 231 included in the transistor 23 is disposed between the insulating layer 221 and the insulating layer 222. A gate electrode 232 included in the transistor 23 is disposed between the insulating layer 222 and the insulating layer 223. The source wiring line 242, the drain wiring line 243, and the scanning line 244 are disposed between the insulating layer 223 and the insulating layer 224. The first constant potential line 245 is disposed between the insulating layer 224 and the insulating layer 225. A first capacitor 25 included in the storage capacitor 256 is disposed between the insulating layer 225 and the insulating layer 226. A second capacitor 26 included in the storage capacitor 256 is disposed between the insulating layer 226 and the insulating layer 227. The data line 246 is disposed between the insulating layer 227 and the insulating layer 228. The second constant potential line 248 and the coupling wiring line 247 are disposed between the insulating layer 228 and the insulating layer 229.

The transistor 23 includes the semiconductor layer 231, the gate electrode 232, and a gate insulating film 233. The semiconductor layer 231 includes a source region 231a, a drain region 231b, a channel region 231c, a first lightly doped drain (LDD) region 231d, and a second LDD region 231e. The channel region 231c is located between the source region 231a and the drain region 231b. The first LDD region 231d is located between the channel region 231c and the source region 231a. The second LDD region 231e is located between the channel region 231c and the drain region 231b. The semiconductor layer 231 is formed, for example, by forming a polysilicon film, and regions excluding the channel region 231c are doped with impurities that enhance conductivity. An impurity concentration in the first LDD region 231d and the second LDD region 231e is lower than an impurity concentration in the source region 231a and the drain region 231b. Note that at least one of the first LDD region 231d and the second LDD region 231e, and particularly the first LDD region 231d, may be omitted.

The gate electrode 232 overlaps the channel region 231c of the semiconductor layer 231 in plan view. The gate electrode 232 is formed, for example, by being doped with impurities that enhance the conductivity of the polysilicon. Note that the gate electrode 232 may be formed using a conductive material, such as metal, metal silicides, and metal compounds. Further, the gate insulating film 233 is interposed between the gate electrode 232 and the channel region 231c. The gate insulating film 233 is configured by silicon oxide formed by thermal oxidation or CVD, for example.

The source region 231a of the transistor 23 is coupled to the source wiring line 242 via a contact portion 271 that penetrates the insulating layer 222 and the insulating layer 223. The source wiring line 242 is coupled to the data line 246 via a contact portion 275 that penetrates the insulating layers 224, 225, 226, and 227. The drain region 231b is coupled to the drain wiring line 243 via a contact portion 272 that penetrates the insulating layers 222 and 223. The drain wiring line 243 is coupled to the second capacitor 26 of the storage capacitor 256 via a contact portion 276 that penetrates the insulating layers 224, 225, and 226. The gate electrode 232 is coupled to the scanning line 244 via a contact portion 273 that penetrates the insulating layer 223. Further, the scanning line 244 is coupled to the above-described light-shielding body 241 via a contact portion 274 that penetrates the insulating layers 221, 222, and 223. The light-shielding body 241 functions as a gate electrode along with the gate electrode 232 of the transistor 23.

Further, the first constant potential line 245 is provided with a shielding portion 270. The shielding portion 270 functions as a shield that suppresses electric-field leakage from the scanning line 244 from affecting the transistor 23 and the drain wiring line 243, and also functions as a light blocking portion of the semiconductor layer 231. For this reason, a first end side of the shield 270 is coupled to the first constant potential line 245, and a portion extending from the first end side penetrates the insulating layer 224 and is disposed up to an intermediate position partway through the insulating layer 223 in the thickness direction. In addition, the shielding portion 270 is disposed in a position overlapping the second LDD region 231e in plan view, and an extending portion of the shielding portion 270 extends from the first constant potential line 245, passes between the scanning line 244 and the drain wiring line 243, and extends to the intermediate position in the thickness direction of the insulating layer 223, which is disposed between the scanning line 244 and the second LDD region 231e. Further, the shielding portion 270 is electrically coupled to the first constant potential line 245, and a constant potential is supplied from the first constant potential line 245.

The storage capacitor 256 includes the first capacitor 25 and the second capacitor 26. The first capacitor 25 includes a pair of electrodes 251 and 252 and a dielectric layer 253. The dielectric layer 253 is disposed between the electrodes 251 and 252. The electrode 251 is disposed on the insulating layer 225. The electrode 251 is coupled to the first constant potential line 245 via a contact portion 277 that penetrates the insulating layer 225. The electrode 252 is coupled to the coupling wiring line 247 via a contact portion 279 that penetrates the insulating layers 226, 227, and 228. The coupling wiring line 247 is coupled to the pixel electrode 28 via a contact portion 283 that penetrates the insulating layer 229.

On the other hand, the second capacitor 26 includes a portion that overlaps with the first capacitor 25 in plan view. The second capacitor 26 includes a pair of electrodes 261 and 262 and a dielectric layer 263. The electrode 261 corresponds to a "second electrode". The electrode 262 corresponds to a "first electrode". The dielectric layer 263 corresponds to a "dielectric body". The dielectric layer 263 is disposed between the electrodes 261 and 262. The electrode 261 is disposed on the insulating layer 226. The electrode 261 is coupled to the electrode 252 of the first capacitor 25 via a contact portion 278 that penetrates the insulating layer 226. The electrode 262 is coupled to the first constant potential line 245 via a contact portion 281 that penetrates the insulating layers 225 and 226. Further, the electrode 262 is coupled to the second constant potential line 248 via a contact portion 282 that penetrates the insulating layers 227 and 228.

Here, a coupling portion 280 is configured by the contact portion 281 and the contact portion 282. The contact portion 281 is a "first coupling portion" that couples the first constant potential line 245 and the electrode 262. The contact portion 282 is a "second coupling portion" that couples the second constant potential line 248 and the electrode 262. Also, in a similar manner to the first constant potential line 245, a constant potential such as a ground potential, for example, is applied to the second constant potential line 248. The constant potential supplied to the first constant potential line 245 and the constant potential supplied to the second constant potential line 248 are the same potential.

Further, the above-described coupling wiring line 247 is disposed in the same layer as the second constant potential line 248, and is disposed in a different layer from the data line 246. Because the data line 246 and the coupling wiring line 247 are not disposed in the same layer, coupling between adjacent lines is suppressed.

Examples of the constituent materials of each of the source wiring line 242, the drain wiring line 243, the scanning line 244, the first constant potential line 245, the data line 246, the coupling wiring line 247, the second constant potential line 248, the electrode 251, the electrode 252, the electrode 261, and the electrode 262, which are all described above, include metals such as tungsten, titanium, chromium, iron, and aluminum, metal nitrides, metal silicides, and the like. Specifically, for example, the electrode 251 and the electrode 252 included in the storage capacitor 256, the electrode 261, and the electrode 262 are each configured by a titanium nitride film. Further, for example, the source wiring line 242, the drain wiring line 243, the scanning line 244, the first constant potential line 245, the data line 246, the coupling wiring line 247, and the second constant potential line 248 are each configured by a layered body of a titanium nitride film, an aluminum film, and a titanium nitride film. By including the aluminum film, those wiring lines can have lower resistance compared to a case in which the wiring lines are configured by only a titanium nitride film.

Further, examples of the constituent materials of the contact portions 271 to 283 include metals such as aluminum and tungsten. Further, for example, the contact portion 274 may be configured integrally with the scanning line 244. In a similar manner to the contact portion 274, the other contact portions 271 to 273 and 275 to 283 may also be configured integrally with the wiring lines or the like to which they are coupled. Also, in a similar manner, the shielding portion 270 may also be configured integrally with the first constant potential line 245.

As described above, the electro-optical device 100 is provided with the first substrate 21, the pixel electrode 28 disposed on the first substrate 21, and the pixel circuit portion 20 disposed between the first substrate 21 and the pixel electrode 28. The pixel circuit portion 20 includes the scanning line 244 disposed along the positive y direction, the data line 246 disposed along the negative x direction, the first constant potential line 245 disposed along the scanning line 244, the second constant potential line 248 disposed along the data line 246, and the transistor 23 disposed corresponding to the intersection position C1 of the scanning line 244 and the data line 246. Further, the pixel circuit portion 20 includes the coupling portion 280 that electrically couples the first constant potential line 245 and the second constant potential line 248. Then, the coupling portion 280 is disposed corresponding to the intersection position C1.

As a result of including the coupling portion 280, the first constant potential line 245 and the second constant potential line 248 are coupled for each of the pixels P. By coupling the first constant potential line 245 and the second constant potential line 248, even if each of the potentials of the first constant potential line 245 and the second constant potential line 248 is affected by the scanning line 244 or the data line 246, a difference in potential between the first constant potential line 245 and the second constant potential line 248 can be reduced. Furthermore, because the wiring line coupling is performed for each of the pixels P, it is possible to suppress the difference in potential between the first constant potential line 245 and the second constant potential line 248 from fluctuating between the pixels P. Further, the difference in potential between the first constant potential line 245 and the second constant potential line 248 can be suppressed from fluctuating between the pixels P due to the influence of each of time constants of the first constant potential line 245 and the second constant potential line 248. Since the fluctuations in the difference in potential between the first constant potential line 245 and the second constant potential line 248 between the pixels P can be suppressed, changes in retention capacity in the storage capacitor 256 can be suppressed for each of the pixels P. As a result, operation failures, such as display unevenness and the like, of the electro-optical device 100 can be suppressed. Thus, even if a number of the pixels P is increased and the size of the pixel P is reduced to enable high-resolution display, operating failures, such as display unevenness, can be reduced.

Also, as described above, the storage capacitor 256 is provided with the electrode 262 as the "first electrode", the electrode 261 as the "second electrode" electrically coupled to the drain region 231b, and the dielectric layer 263 as the "dielectric body" disposed between the electrode 262 and the electrode 261. Further, the coupling portion 280 includes the contact portion 281 as the "first coupling portion" coupling the first constant potential line 245 and the electrode 262, and the contact portion 282 as the "second coupling portion" coupling the second constant potential line 248 and the electrode 262. Accordingly, the first constant potential line 245 and the second constant potential line 248 are electrically coupled, via the electrode 262, by the contact portion 281 and the contact portion 282. Thus, the first constant potential line 245 and the second constant potential line 248 can each function as a capacitance line. Further, when the contact portion 281 and the contact portion 282 are coupled via the electrode 262, it is possible to increase a degree of freedom in the arrangement and dimensions of the storage capacitor 256, the first constant potential line 245, the second constant potential line 248, the contact portion 281, and the contact portion 282, in comparison to a case in which the contact portion 281 and the contact portion 282 are coupled, but not via the electrode 262.

Further, as described above, the storage capacitor 256 is disposed in the insulating layers 225, 226, and 227, which are the layers between the first constant potential line 245 and the second constant potential line 248. Thus, for example, compared to a case in which the storage capacitor 256 is not disposed between the first constant potential line 245 and the second constant potential line 248, it is possible to avoid the electrical coupling between the first constant potential line 245 and the second constant potential line 248 with respect to the storage capacitor 256 from becoming complex.

Further, as described above, the storage capacitor 256 includes the first capacitor 25 and the second capacitor 26. As a result, the capacity can be increased compared to a case in which the storage capacitor 256 includes only one capacitor. As a result, the voltage can be suitably held.

Further, the electrode 251 of the first capacitor 25 and the electrode 262 of the second capacitor 26 are electrically coupled to the first constant potential line 245. Therefore, the constant potential is supplied to the electrode 251 and the electrode 262. Then, the electrode 252 and the electrode 261 that are electrically coupled to the drain region 231b are disposed between the electrode 251 and the electrode 262. Therefore, it is possible to inhibit the electrode 252 and the electrode 261 from being subjected to electrical interaction with other wiring lines, such as the data lines 246. Thus, changes in the retention capacity in the storage capacitor 256 can be more effectively suppressed. Further, by disposing the first capacitor 25 and the second capacitor 26 so that the electrode 252 and the electrode 261 are positioned between the electrode 251 and the electrode 262, the number of contacts for electrically coupling the storage capacitor 256 and the pixel electrode 28 can be reduced. Similarly, the number of contacts for electrically coupling the storage capacitor 256 and the drain region 231b can be reduced.

Further, as described above, the first constant potential line 245 and the second constant potential line 248 are electrically coupled via the electrode 262 of the second capacitor 26. Thus, the degree of freedom in the arrangement and dimensions of the first constant potential line 245, the second constant potential line 248, the contact portion 281, and the contact portion 282 can be increased in comparison to a case in which these are electrically coupled via the electrode 251 of the first capacitor 25.

Further, as described above, the second constant potential line 248 is disposed in the insulating layers 228 and 229, which are the layers between the data line 246 and the pixel electrode 28. Therefore, electrical interaction, such as coupling due to parasitic capacitance, between the data line 246 and the pixel electrode 28 can be suppressed. Thus, fluctuations in the potential of the pixel electrode 28 caused by the influence of the data line 246 can be effectively suppressed. Further, the first constant potential line 245 is disposed in the insulating layers 224 and 225, which are the layers between the scanning line 244 and the storage capacitor 256. As a result, fluctuations in the electrostatic capacity in the storage capacitor 256 caused by the influence of the scanning line 244 can be suppressed.

Furthermore, the first constant potential line 245 overlaps with the scanning line 244 when viewed from the negative z direction. Therefore, compared to a case in which the first constant potential line 245 does not overlap with the scanning line 244, the fluctuations in the potential of the pixel electrode 28 can be more effectively suppressed. Further, the second constant potential line 248 overlaps with the data line 246 when viewed from the negative z direction. Therefore, compared to a case in which the second constant potential line 248 does not overlap with the data line 246, fluctuations in the electrostatic capacity in the storage capacitor 256 caused by the influence of the data line 246 can be more effectively suppressed.

Further, as described above, the contact portion 274 may be formed integrally with the scanning line 244 as described above, but is preferably formed separately from the scanning line 244. In this case, a contact hole is formed in the insulating layers 221, 222, and 223, and the contact portion 274 is formed by embedding tungsten or the like in the contact hole. In other words, when the constituent material of the contact portion 274 is tungsten, the contact portion 274 is preferably configured by a tungsten plug. By configuring the contact portion 274 as the tungsten plug, the thickness of the scanning line 244 can be made thinner than in a case in which the contact portion 274 is configured integrally with the scanning line 244. As a result, the thickness of the insulator 22 can be reduced, and thus the optical characteristics of the element substrate 2 can be enhanced. Note that the same applies to the other contact portions 271 to 273, and 275 to 281. Further, the above-described light-shielding body 241 need not necessarily function as the gate electrode. In this case, the light-shielding body 241 may be configured by an insulating material.

2. Modified Examples

Each of the embodiments exemplified above can be variously modified. Specific modes of modification applied to each of the embodiments described above are exemplified below. Two or more modes freely selected from exemplifications below can be appropriately used in combination as long as mutual contradictions do not arise.

2-1. Modified Example 1

Figure 7:
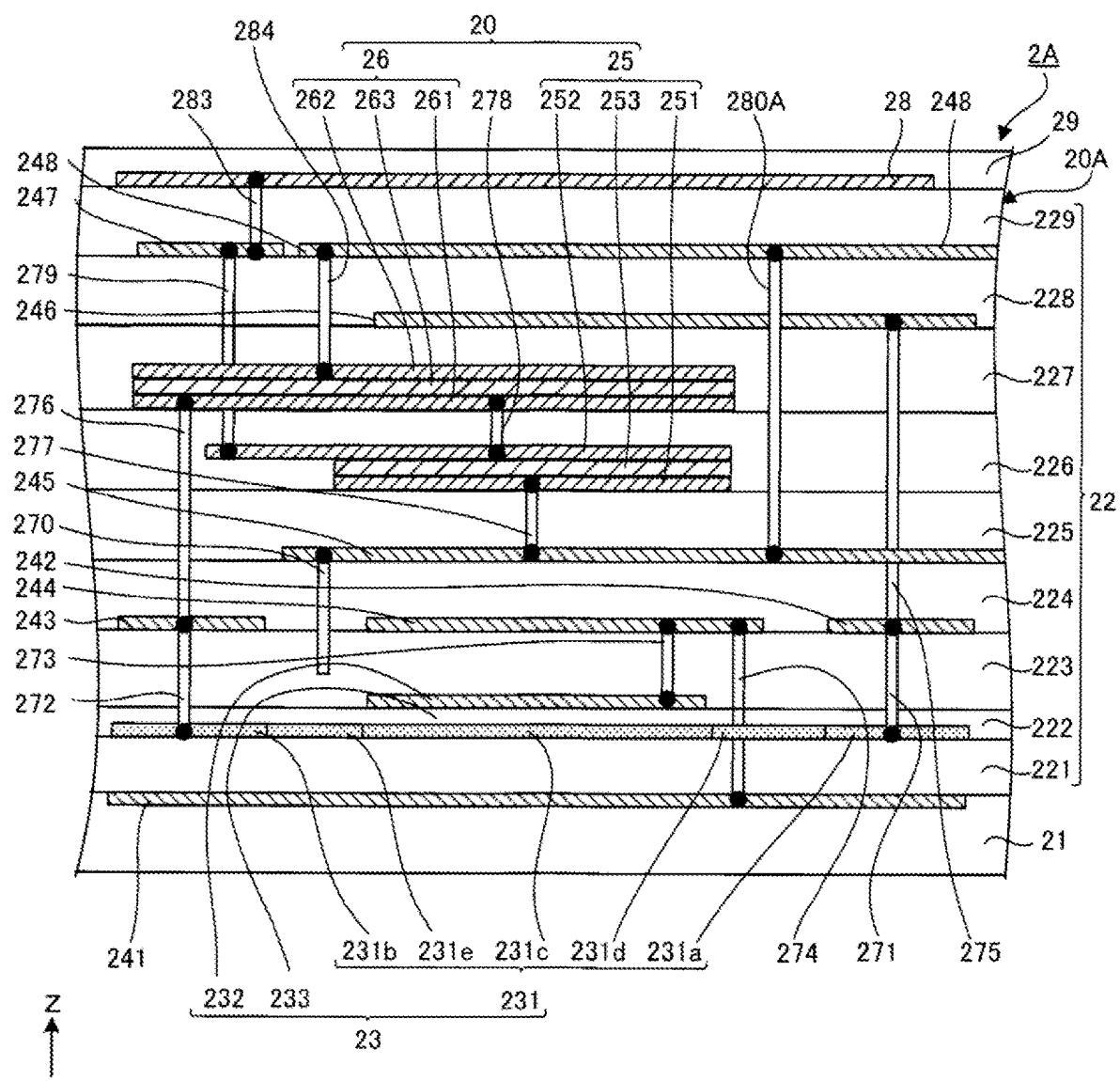
FIG. 7 is a cross-sectional view schematically illustrating a part of an element substrate according to Modified Example 1.

In the embodiment described above, the coupling portion 280 is configured by the contact portion 281 and the contact portion 282, but the configuration of the coupling portion 280 is not limited to this example. FIG. 7 is a cross-sectional view schematically illustrating a part of an element substrate 2A according to Modified Example 1. A pixel circuit portion 20A of the element substrate 2A includes a coupling portion 280A. The coupling portion 280A directly couples the first constant potential line 245 and the second constant potential line 248. In other words, the coupling portion 280A electrically couples the first constant potential line 245 and the second constant potential line 248 without passing through the electrode 262. According to such a configuration, it is possible to reduce the resistance of the first constant potential line 245 and the second constant potential line 248. Further, as illustrated in FIG. 7, the element substrate 2A is provided with a contact portion 284 that electrically couples the second constant potential line 248 and the electrode 262. By providing the contact portion 284, the second constant potential line 248 can be suitably used as a capacitance line.

2-2. Modified Example 2

Figure 8:
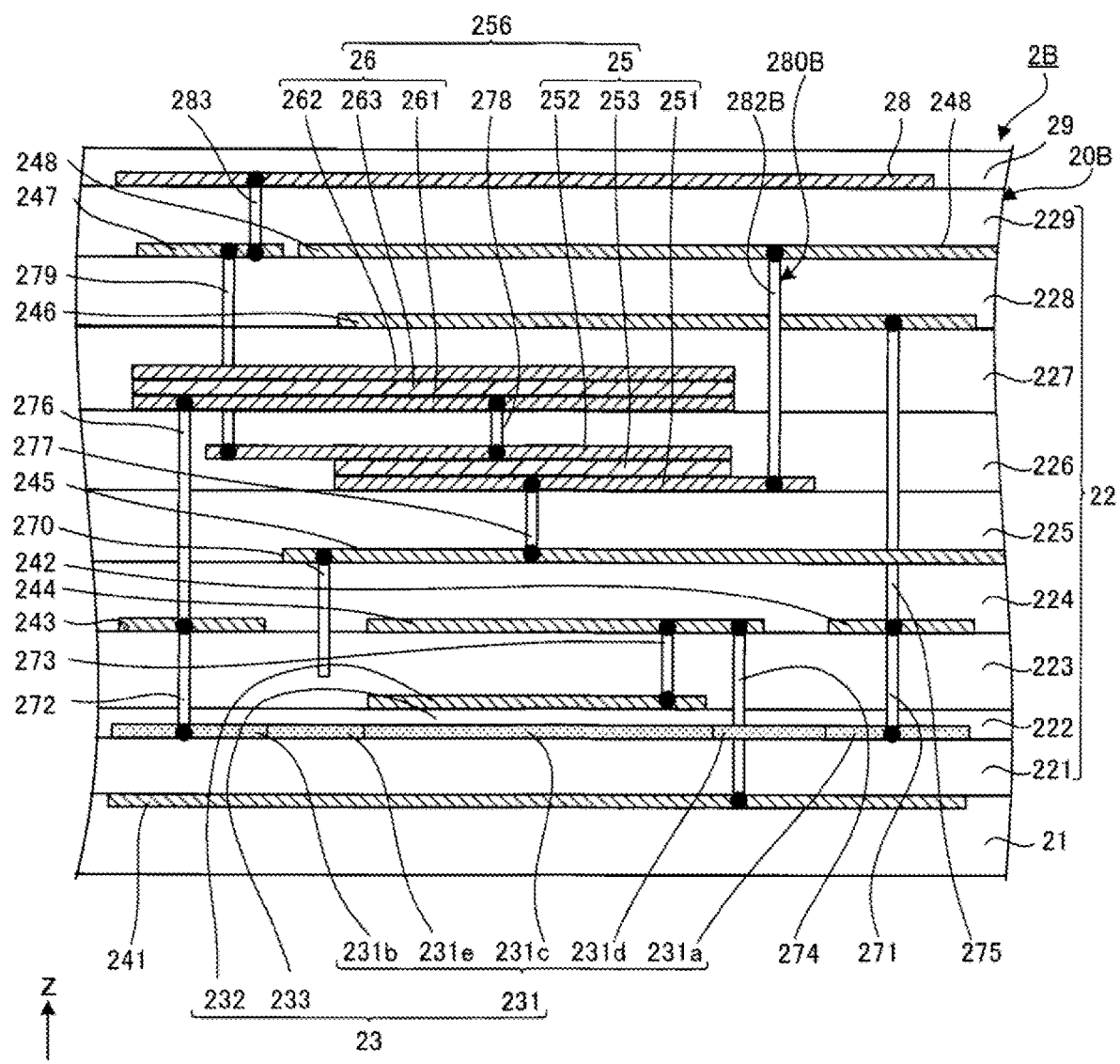
FIG. 8 is a cross-sectional view schematically illustrating a part of an element substrate according to Modified Example 2.

FIG. 8 is a cross-sectional view schematically illustrating a a part of an element substrate 2B according to Modified Example 2. A pixel circuit portion 20B of the element substrate 2B includes a coupling portion 280B. The coupling portion 280B includes a contact portion 282B and the contact portion 277, and the contact portion 277, which electrically couples the first constant potential line 245 and the second constant potential line 248, electrically couples the first constant potential line 245 and the electrode 251. The contact portion 282B electrically couples the second constant potential line 248 and the electrode 251. In the example illustrated in FIG. 8, the contact portion 277 corresponds to the "first coupling portion" that couples the first constant potential line 245 and the electrode 251. The contact portion 282B corresponds to the "second coupling portion" that couples the second constant potential line 248 and the electrode 251. Further, the electrode 251 corresponds to the "first electrode", the electrode 252 corresponds to the "second electrode", and the "dielectric body" corresponds to the dielectric layer 253.

2-3. Modified Example 3

In the above-described embodiment, the coupling portion 280 is provided in all of the pixels P, but, of all the pixels P, the coupling portion 280 may be provided only in some of the chosen pixels P. Note however that, by providing the coupling portion 280 in all of the pixels P, the display unevenness can be particularly effectively reduced.

2-4. Modified Example 4

In the above-described embodiment, the first capacitor 25 and the second capacitor 26 are disposed in the layers between the first constant potential line 245 and the second constant potential line 248, but the arrangement of each of the first capacitor 25 and the second capacitor 26 is not limited thereto. For example, the second capacitor 26 may be disposed in the layer between the second constant potential line 248 and the pixel electrode 28. Further, the storage capacitor 256 includes the first capacitor 25 and the second capacitor 26, but the storage capacitor 256 may be configured by one capacitor.

2-5. Modified Example 5

In the above-described embodiment, the first constant potential line 245 and the second constant potential line 248 each function as the capacitance line, but both or one of these need not necessarily function as the capacitance line. Note that it is preferable that at least one of the first constant potential line 245 and the second constant potential line 248 function as the capacitance line, since it is necessary to separately provide a capacitance line when both do not function as the capacitance line. When at least one of the first constant potential line 245 and the second constant potential line 248 functions as the capacitance line, the thickness of the element substrate 2 can be made thinner, and a deterioration in optical characteristics can be suppressed.

2-6. Modified Example 6

In the above-described embodiment, the first constant potential line 245 is disposed further to the positive z axis side than the scanning line 244, but, depending on an arrangement of the various wiring lines, the first constant potential line 245 may be disposed further to the negative z axis side than the scanning line 244. Similarly, in the above-described embodiment, the second constant potential line 248 is disposed further to the positive z axis side than the data line 246, but, depending on the arrangement of the various wiring lines, the second constant potential line 248 may be disposed further to the negative z axis side than the data line 246.

2-7. Modified Example 7

In the above-described embodiment, the first constant potential line 245 need not necessarily overlap with the scanning line 244 in plan view. Similarly, the second constant potential line 248 need not necessarily overlap with the data line 246 in plan view.

2-8. Modified Example 8

In the above-described embodiment, a case in which the "transistor" is the TFT has been described as an example, but the "transistor" is not limited to this example, and may be, for example, a metal-oxide-semiconductor field-effect transistor (MOSFET), or the like.

3-1. Electronic Apparatus

The electro-optical device 100 can be used in various electronic apparatuses.

Figure 9:
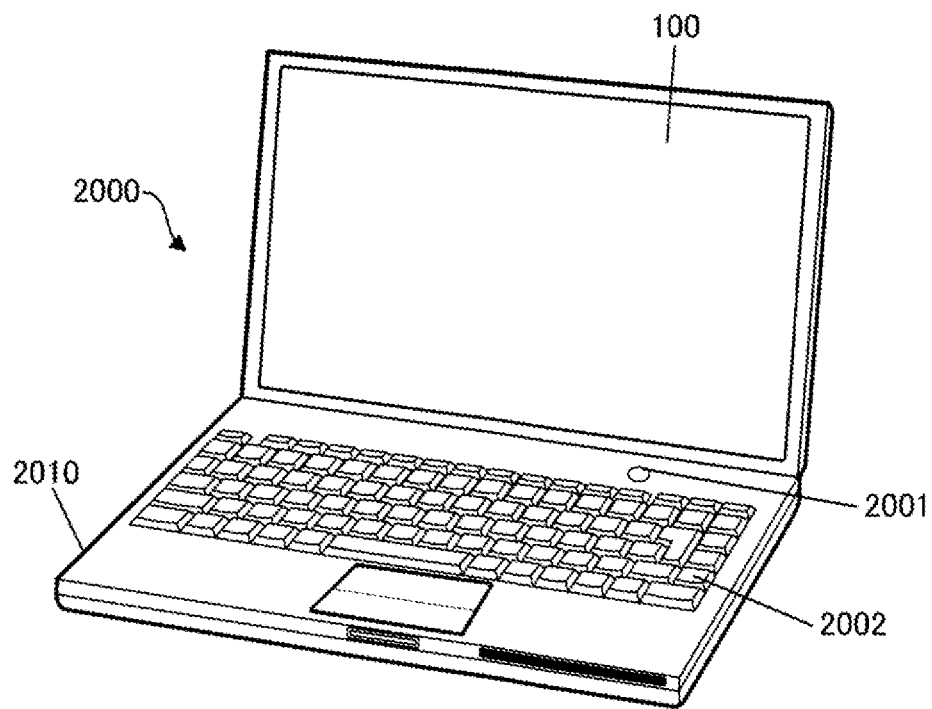
FIG. 9 is a perspective view illustrating a personal computer that is an example of an electronic apparatus.

FIG. 9 is a perspective view illustrating a personal computer 2000 as an example of the electronic apparatus. The personal computer 2000 includes the electro-optical device 1 that displays various images, and a main body portion 2010 in which a power source switch 2001 and a keyboard 2002 are installed.

Figure 10:
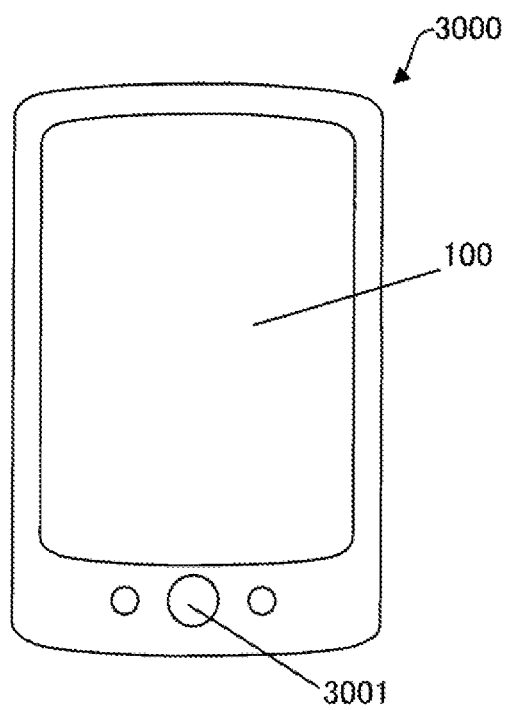
FIG. 10 is a perspective view illustrating a smart phone that is an example of the electronic apparatus.

FIG. 10 is a perspective view illustrating a smart phone 3000 as an example of the electronic apparatus. The smart phone 3000 includes an operation button 3001, and the electro-optical device 100 that displays various images. The screen content displayed on the electro-optical device 100 is changed in accordance with operation of the operation button 3001.

Figure 11:
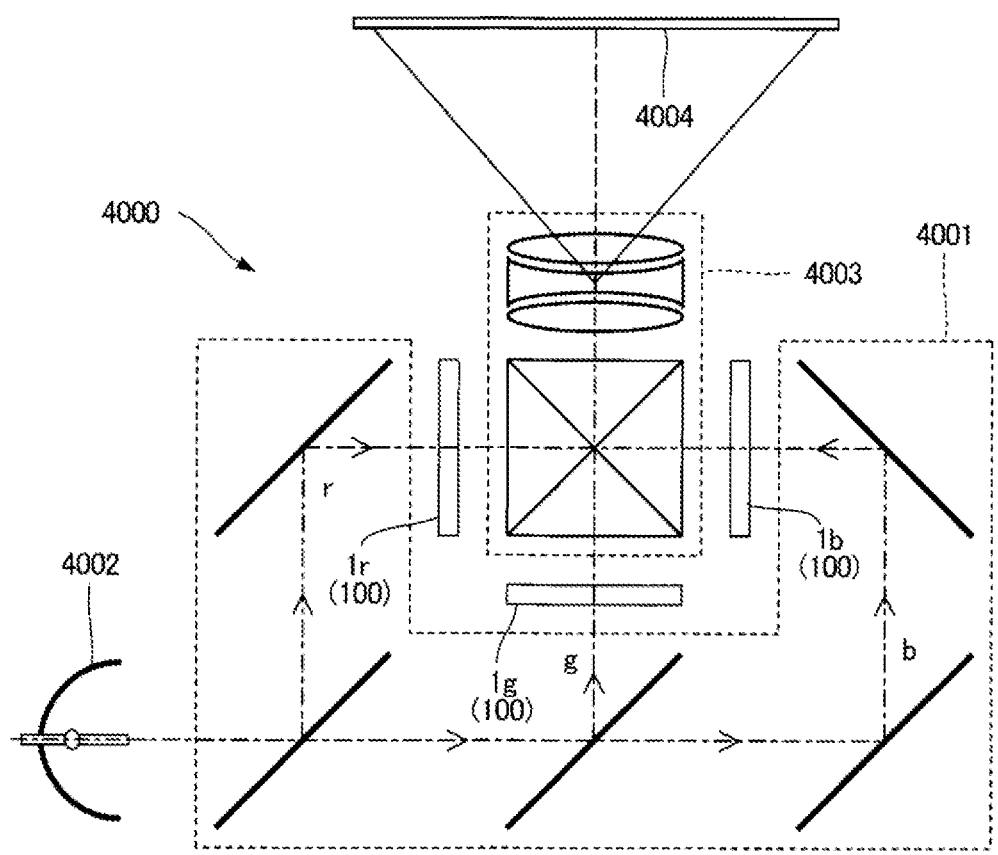
FIG. 11 is a schematic view illustrating a projector that is an example of the electronic apparatus.

FIG. 11 is a schematic diagram illustrating a projector, which is an example of the electronic apparatus. A projection-type display device 4000 is a three-plate type projector, for example. An electro-optical device 1r is the electro-optical device 100 corresponding to a red display color, an electro-optical device 1g is the electro-optical device 100 corresponding to a green display color, and an electro-optical device 1b is the electro-optical device 1 corresponding to a blue display color. Specifically, the projection-type display device 4000 includes the three electro-optical devices 1r, 1g, and 1b that respectively correspond to the display colors of red, green, and blue.

Of light emitted from an illumination device 4002 that is a light source, an illumination optical system 4001 supplies a red component r to the electro-optical device 1r, a green component g to the electro-optical device 1g, and a blue component b to the electro-optical device 1b. Each of the electro-optical devices 1r, 1g, and 1b functions as an optical modulator, such as a light bulb, that modulates each of monochromatic light supplied from the illumination optical system 4001, in accordance with display images. A projection optical system 4003 synthesizes the light emitted from each of the electro-optical devices 1r, 1g, and 1b and projects the synthesized light onto a projection surface 4004.

The personal computer 2000, the smart phone 3000, and the projection-type display device 4000 each include the above-described electro-optical device 100. By being provided with the electro-optical device 100, the quality of each display in the personal computer 2000, the smart phone 3000, and the projection-type display apparatus 4000 can be enhanced.

The present disclosure has been described above based on the preferred embodiment, but the present disclosure is not limited to the embodiment described above. In addition, the configuration of each component of the present disclosure may be replaced with fulfills the equivalent functions of the above-described embodiment, or any configuration may be added thereto.

Note that examples of the electronic apparatus to which the electro-optical device according to the present disclosure is applied are not limited to the exemplified apparatuses, and include, for example, a personal digital assistant (PDA), a digital camera, a television, a video camera, a car navigation device, a display device for in-vehicle use, an electronic organizer, electronic paper, an electronic calculator, a word processor, a workstation, a video telephone, a point of sale (POS) terminal, and the like. Other examples of the electronic apparatus to which the present disclosure is applied further include a printer, a scanner, a copier, a video player, a device provided with a touch panel, and the like.

Further, in the above description, the liquid crystal device is described as an example of the electro-optical device of the present disclosure, but the electro-optical device of the present disclosure is not limited to that example. For example, the electro-optical device of the present disclosure can also be applied to an image sensor or the like. Further, for example, in a similar manner to the embodiment described above, the present disclosure can also be applied to a display panel using a light-emitting device, such as organic electroluminescence (EL), inorganic EL, or a light-emitting polymer. Further, in a similar manner to the embodiment described above, the present disclosure can also be applied to an electrophoretic display panel using micro capsules each including colored liquid and white particles distributed in the liquid.

What is claimed is:

1. An electro-optical device comprising:
    a scanning line disposed along a first direction;
    a data line disposed along a second direction intersecting the first direction;
    a first constant potential line disposed along the scanning line;
    a second constant potential line including:
        a first body portion disposed along the data line, and
        a first protrusion portion protruding from the first body portion along the scanning line;
    a storage capacitor including an electrode, the electrode including:
        a second body portion, and
        a second protrusion portion protruding from the second body portion along the scanning line;
    a coupling portion configured to electrically couple the first constant potential line and the first protrusion portion of the second constant potential line, the coupling portion being disposed in a region overlapping with the second protrusion portion of the electrode; and
    a pixel electrode, wherein
    the first constant potential line is disposed in a first layer between the scanning line and the pixel electrode, and
    the second constant potential line is disposed in a second layer between the first constant potential line and the pixel electrode.

2. The electro-optical device according to claim 1, wherein
    the coupling portion includes
        a first coupling portion configured to couple the first constant potential line and the electrode of the storage capacitor, and
        a second coupling portion configured to couple the second constant potential line and the electrode of the storage capacitor.

3. The electro-optical device according to claim 2, wherein
    the storage capacitor is disposed in a third layer between the first constant potential line and the second constant potential line.

4. The electro-optical device according to claim 2, wherein
    the first constant potential line is disposed between the scanning line and the storage capacitor, and
    the second constant potential line is disposed between the data line and the pixel electrode.

5. The electro-optical device according to claim 1, further comprising:
    a substrate,
    wherein
    the first constant potential line overlaps the scanning line when viewed from a third direction in which the substrate and the pixel electrode overlap each other, and
    the second constant potential line overlaps the data line when viewed from the third direction.

6. An electronic apparatus, comprising:
    the electro-optical device according to claim 1.

7. An electro-optical device comprising:
    a scanning line disposed along a first direction;
    a data line disposed along a second direction intersecting the first direction;
    a first light-shielding member disposed along the scanning line and to which a constant potential is applied;
    a second light-shielding member to which the constant potential is applied, the second light-shielding member including:
        a first body portion disposed along the data line, and
        a first protrusion portion protruding from the first body portion along the scanning line;
    a storage capacitor including an electrode, the electrode including:
        a second body portion, and
        a second protrusion portion protruding from the second body portion along the scanning line;
    a connecting portion configured to electrically connect the first light-shielding member and the first protrusion portion of the second light-shielding member, the connecting portion being disposed in a region overlapping with the second protrusion portion of the electrode; and
    a pixel electrode, wherein
    the first light-shielding member is disposed in a first layer between the scanning line and the pixel electrode, and
    the second light-shielding member is disposed in a second layer between the first light-shielding member and the pixel electrode.

* * * * *